United States Patent
Lavoie

(10) Patent No.: US 7,799,679 B2
(45) Date of Patent: Sep. 21, 2010

(54) LIQUID PHASE MOLECULAR SELF-ASSEMBLY FOR BARRIER DEPOSITION AND STRUCTURES FORMED THEREBY

(75) Inventor: Adrien R. Lavoie, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/215,073

(22) Filed: Jun. 24, 2008

(65) Prior Publication Data

US 2009/0315181 A1    Dec. 24, 2009

(51) Int. Cl.
*H01L 23/52* (2006.01)

(52) U.S. Cl. .............. 438/674; 438/597; 257/E21.575

(58) Field of Classification Search ............ 438/597, 438/674, 678; 257/E21.575
See application file for complete search history.

(56) References Cited

U.S. PATENT DOCUMENTS

| 3,674,550 | A  | * | 7/1972  | Mallory ............... 427/97.2 |
| 6,444,263 | B1 |   | 9/2002  | Paranjpe et al. |
| 6,881,669 | B2 |   | 4/2005  | Chu et al. |
| 7,459,392 | B2 |   | 12/2008 | Johnston et al. |
| 2004/0219784 | A1 | * | 11/2004 | Kang et al. ............. 438/653 |

OTHER PUBLICATIONS

International Search Report/Written Opinion received for PCT Patent Application No. PCT/US2009/046681 mailed on Jan. 20, 2010.

* cited by examiner

*Primary Examiner*—Matthew Smith
*Assistant Examiner*—Michele Fan
(74) *Attorney, Agent, or Firm*—Kathy J. Ortiz

(57) ABSTRACT

Methods and associated structures of forming a microelectronic structure are described. Those methods may comprise dissolving a metal precursor in a non-aqueous solvent in a bath; placing a substrate comprising an interconnect opening in the bath, wherein the metal precursor forms a monolayer within the interconnect opening; and placing the substrate in a coreactant mixture, wherein the coreactant reacts with the metal precursor to form a thin barrier monolayer.

11 Claims, 3 Drawing Sheets

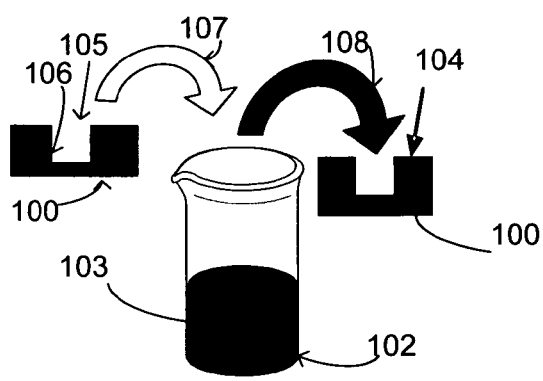
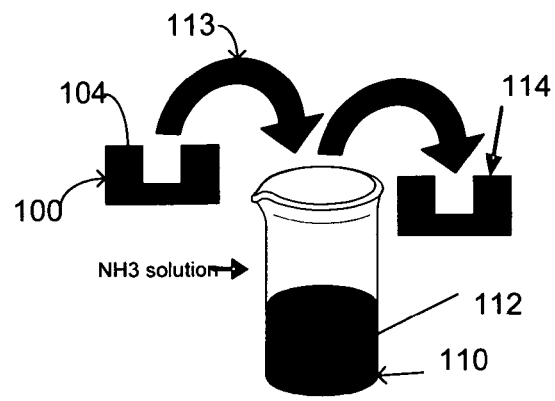
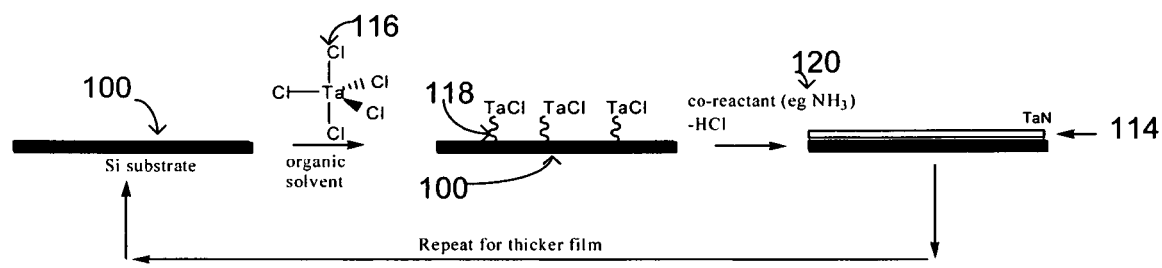
FIG. 1a
FIG. 1b
FIG. 1c

LIQUID PHASE MOLECULAR SELF-ASSEMBLY FOR BARRIER DEPOSITION AND STRUCTURES FORMED THEREBY

BACKGROUND OF THE INVENTION

In the manufacture of integrated circuits, interconnect structures are generally formed on a semiconductor substrate using a dual damascene process. Such a process begins with a trench being etched into a dielectric layer and filled with a barrier layer, an adhesion layer, and a seed layer. A physical vapor deposition (PVD) process, such as a sputtering process, or an atomic layer deposition (ALD) process, may be used to deposit the barrier layer into the trench. The barrier layer prevents copper, for example, from diffusing into the underlying dielectric layer. As device dimensions scale down, the aspect ratio of the trench may become more aggressive as the trench becomes narrower. This gives rise to issues such as trench overhang during a barrier layer formation, for example, which may lead to pinched-off trench openings and inadequate gapfill.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 1a-1e represent cross-sections of structures that may be formed when carrying out an embodiment of the methods of the present invention.

DETAILED DESCRIPTION OF THE PRESENT INVENTION

Figure 1D:
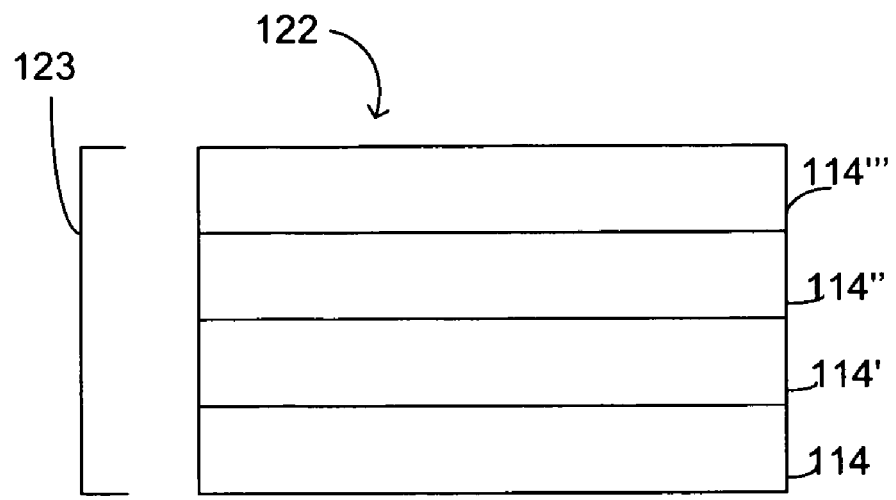

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure, such as a copper interconnect structure, are described. Those methods may comprise dissolving a metal precursor in a bath, placing a substrate comprising an interconnect opening in the bath, wherein the metal precursor forms a monolayer within the opening, and placing the substrate in a coreactant mixture, wherein the coreactant reacts with the metal precursor to form a thin barrier monolayer. The thin conformal barrier layer may enable the formation of single atomic layer, conformal, smooth barrier films thus enabling gapfill for high aspect ratio interconnect structures.

In an embodiment of the method of the present invention, as illustrated by FIGS. 1a-1e, a substrate 100 may be placed in a bath 102. The bath 102 may comprise a plating bath 102, for example. The substrate 100 may comprise materials such as silicon, silicon-on insulator, germanium, indium antimonide, lead telluride, indium arsenide, indium phosphide, gallium arsenide, or gallium antimonide. Although several examples of materials from which the substrate 100 may be formed are described here, any material that may serve as a foundation upon which a microelectronic device may be built falls within the spirit and scope of the present invention.

In an embodiment, the substrate 100 may comprise an interconnect opening 105 within a dielectric layer, which may comprise a copper interconnect opening, such as a Damascene structure interconnect opening, for example. In an embodiment, the interconnect opening may comprise a high aspect interconnect opening, which may comprise an aspect ratio of greater than about 3:1. In an embodiment, the interconnect opening may comprise a portion of an interconnect structure of a microelectronic device.

In an embodiment, the bath 102 may comprise a metal precursor and a solvent 103. In an embodiment, the bath 102 may comprise an oxygen and water-free solvent, such as but not limited such solvents as toluene and alkanes such as pentane, hexane, cyclohexane, acetonitrile. By way of illustration and not limitation, the metal precursor may comprise a barrier metal, such as titanium, tantalum, hafnium and zirconium. Examples of titanium metal precursors may comprise such compounds as TiCl4, TiMe4, Cp2Ti(CO)2, Cp2TiCl2, and Ti(NEt2)4. In an embodiment, the metal precursor may comprise a single metal center organometallic compound. In an embodiment, the single metal center comprises one of titanium, tantalum, zirconium and hafnium.

Examples of tantalum metal precursors may include CpTa$(CO)_4$, CpTa$(CO)_4$, (MeCp)Ta$(CO)_4$, CpTa$(CO)_3$(R), where R=PPh$_3$ or AsPh$_3$, Cp$_2$TaH$_3$, CpTa$(CO)_3$(R), where R=THF, PPh$_3$, or PCy$_3$, CpTa$(CO)_2$(C$_5$H$_6$), Cp$_2$TaH(CO), CP$_2$TaR (CO) where R=Me, CH$_2$Ph, or Ph, [Cp$_3$Ta$_3$(CO)$_7$], [Cp$_2$TaH (CH$_2$=CHR'], [Cp$_2$Ta(CH$_2$CH$_2$R')(CNR)], CpTaXMe(CH-CMe$_3$)] where X=Cl or Me, [Cp'TaX(CH$_2$Ph)(CHPh)] where Cp'=C$_5$H$_4$Me, C$_5$Me$_5$ and X=Cl or CH$_2$Ph, Cp*Ta (PMe$_3$)(C$_2$H$_4$)(CHCMe$_3$), [Cp$_2$TaMe(CH$_2$)], [Cp(MeCp)Ta-Me(CH$_2$)], [Cp$_2$TaMe(CHR)], where R=H, Me, Ph, or SiMe$_3$, [Cp$_2$Ta(CHPh$_2$)(CHCMe$_3$)], [Cp$_2$Ta(CH$_2$Ph) (CHPh)], Cp*TaMe$_3$Ph, Cp*TaMe$_2$(Me$_2$CO), Cp*TaMe$_2$ (C$_6$H$_4$), Cp$_2$TaMe$_3$, (Cp$_2$TaMe$_2$)$^+$, (Cp$_2$Ta(CH$_2$SiMe$_3$)$_2$)$^+$, Cp$_2$TaPh$_2$, Cp*TaMe$_4$, Cp$_2$Ta(CP)$_2$, Cp'Me$_2$Ta(indanyl or other metalacycle, TBTDET, PDMAT, TaCl5, Cp$_2$TH (CH$_2$=CHR) where R=Me, Et, or Prn, Cp$_2$Ta(cyclopentene), Cp$_2$Ta(benzyl)(CHPh), Cp$_2$ClTaCH(tBu), CpTa(CH(tBu)X (PMe$_3$)$_2$, Cp$_2$TaMe(C$_2$H$_4$), CH$_2$=Ta(Cp)$_2$CH$_3$, Cp$_2$TaPrn (C$_8$H$_8$), CpTa(CO)$_x$(PhCCPh) where x=1 or 2, Cp$_2$Ta(allyl), Cp$_2$M(methallyl), Cp'TaH$_3$, CpTaCO$_4$, Cp$_2$TaH(CO), Cp$_2$Ta (allyl), Cp$_2$TaH(propene), Cp$_2$TaMe$_3$, Cp*TaCO$_4$, Cp*TaMe$_4$, Cp$_2$(Prn)(CNMe), Cp*TaMe$_2$(benzene), Cp*Ta (=CHCMe$_3$)(ethane)PMe$_3$. The single metal center may also be a Ta carbonyl compound such as Ta$(CO)_3$(C$_7$H$_7$), [Ta$(CO)_6$]$^-$, [Ta$(CO)_6$], Ta$_2$$(CO)_{12}$, Ta$(CO)_5$(Py)$^-$, Ta$(CO)_2$ (dmpe)$_2$, TaX$(CO)_2$[Me$_2$P(CH$_2$)$_2$PR$_2$]$_2$ where X=Cl or I and R=Et or iPr, (RHg)Ta$(CO)_6$ where R=Et or Ph, Ph$_3$SnTa $(CO)_6$, [(C$_5$H$_4$Bu)Ta$(CO)_3$\{Si(C$_{18}$H$_{37}$)$_2$\}]$_2$, and [Na(diglyme)$_2$][Ta$(CO)_6$], or allyl compounds such as Ta(allyl)$_4$, Ta(1-methylallyl)(C$_4$H$_6$)$_6$, alkyl, benzyl, or aryl compounds such as TaMe$_5$, Ta(CH$_2$Ph)$_5$, TaMe$_3$(CH$_2$SiMe$_3$)$_2$, (TaMe$_7$)$_2^-$, (TaPh$_6$)$_3^-$, (TaPh$_6$)$_4^-$, [TaR$_6$]$^-$ where R=Ph or p-tolyl, [TaMe$_3$(C$_8$H$_8$)], TaMe(C$_8$H$_8$)(C$_8$H$_8$), TaCl$_2$Me (C$_8$H$_8$), TaMe(C$_8$H$_8$)(C$_8$H$_8$), TaCl$_2$Me[C(Me)=NR]$_2$ where R=Cy or p-Tol, [Ta(CH$_2$SiMe$_3$){N(SiMe$_3$)$_2$}$_2$(CHSiMe$_3$)], and [Ta(CH$_2$SiMe$_3$)$_2$]$_2$(μ-CSiMe$_3$)$_2$, or alkylidene compounds such as [(Me$_3$CO)$_3$Ta[CHC(Me)$_3$], [Ta(OtBu)$_3$ (CHCMe$_3$)], [TaXL$_2$(CHCMe$_3$)$_2$ where X=Cl, Me, Np and L=PMe$_3$ or PMe$_2$Ph, [{TaX(PMe$_3$)}$_2$(μ-N$_2$)] where X=Cl, Me or Np, Ta(mesityl)(CHCMe$_3$)$_2$(PMe$_3$)$_2$, [Cp$_2$TaMe (CH$_2$)], [Cp(MeCp)TaMe(CH$_2$)], CpTaC(CMe$_3$)(Cl) (PMe$_3$)$_3$, and Ta(CH$_2$CMe$_3$)$_3$(CHCMe$_3$) and other Ta single metal center organometallic compounds such as complexes of the type: TaXR$_4$, TaX$_2$R$_3$, TaX$_3$R$_2$, TaX$_4$R including metallacyclic compounds.

Examples of hafnium metal precursors may include HfCl4, HfMe4, Cp2Hf(CO)2, Cp2HfCl2 and Hf(NEt2)4. Examples of zirconium metal precursors include ZrCl4, ZrMe4, Cp2Zr (CO)2, Cp2ZrCl2 and Zr(NEt2)4. In an embodiment, the metal precursor may be dissolved in the non-aqueous solvent 103. The metal precursor may be prepared at a desired concentration with the solvent in the metal bath 102. In an embodiment, the bath 102 may be warmed to a desired temperature (such as about 25 degrees to about 90 degrees Celsius, in some cases) followed by immersion 107 of the substrate 100 into the bath 102 for a desired time. The bath 102 containing the substrate 100 may be optionally agitated. Subsequently, the substrate 100 may be removed 108 from the bath 102 and may be rinsed with the organic solvent 103 that does not contain dissolved coreactant, in some embodiments.

The metal precursor may be adsorbed onto a surface 106 of the interconnect opening 105 of the substrate 100. The metal precursor may form a monolayer 104 on the surface 106 of the interconnect opening 105, which may comprise an atomic layer of the metal precursor that may be adsorbed onto the surface 106 of the substrate 100. In an embodiment, the monolayer may comprise less than about 0.5 angstroms.

The substrate 100 comprising the monolayer 104 may be placed 113 in a coreactant bath 110 mixture comprising a coreactant 112 (FIG. 1b). The coreactant 112 may comprise NH$_3$, tBuNH2, HNEt2, NEt$_3$, hexane, catechol borane, BH3/B2H6, CH$_4$, SiH$_4$, GeH$_4$ in some embodiments. The coreactant 112 may comprise a compound that may react with the monolayer 104 of the metal precursor to form a barrier monolayer 114. In an embodiment, the coreactant may exchange ligands with the monolayer 104 (FIG. 1c). For example, as shown in FIG. 1c, when the metal precursor comprises TaCl$_4$, the Cl ligand 116 may be adhered 118 to the surface of the substrate 100. When the substrate 100 is placed in the coreactant bath 110, a ligand 120 of the coreactant 112, in this example the nitrogen atom of the NH$_3$ coreactant, may be exchanged with the CL ligand 116 of the metal precursor. In this manner, the barrier monolayer 114 may be formed by exchanging ligands of the metal precursor with those of the coreactant.

The substrate 100 may remain in the coreactant bath 110 for a desired time, and the formation of the barrier monolayer 114 may be repeated to form successive barrier monolayers (for example 114, 114', 114", 114''' that may be formed upon each other) to form a desired, targeted thickness 123 of the barrier layer 122 (FIG. 1d). For example, the substrate 100 may be removed from the coreactant bath 110, rinsed with an organic solvent and the process of monolayer 114 formation may be optionally repeated.

In an embodiment, the barrier monolayer 114 may comprise a thickness of about 1 angstrom or less. In an embodiment, the barrier monolayer 114 may comprise between about 0.2 angstroms to about 1.0 angstrom. The barrier layer 122 may comprise a thin conformal barrier layer 122 that may comprise a plurality of barrier monolayers 114, 114', 114", 114''' for example) stacked upon each other.

Figure 1E:
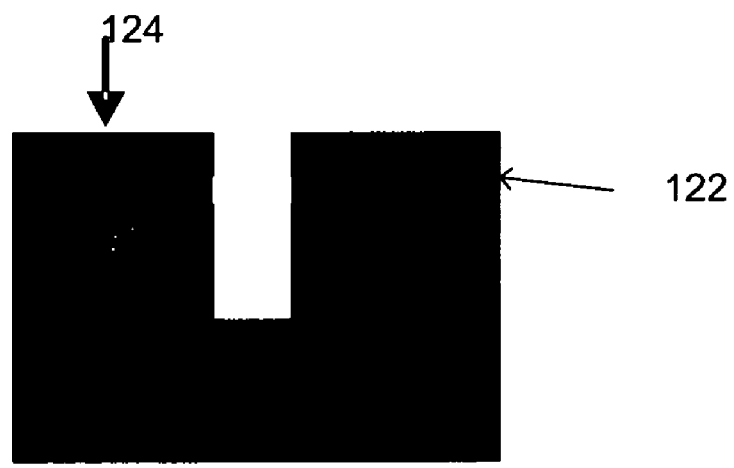

The barrier layer 122 (that may comprise a single barrier monolayer 114 in some cases) may serve to prevent the diffusion of a conductive material 124 (such as a copper interconnect structure 124 for example) that may be subsequently formed across the barrier layer 122 (FIG. 1e). In one embodiment, the barrier layer 122 can range from a monolayer/atomic layer to about 500 angstroms, and may be less than 50 angstroms in some cases. In one embodiment, the conductive layer 124 may be formed utilizing a physical vapor deposition (PVD) and/or an electroplating/electroless processes, for example. In an embodiment, the barrier layer 122 may comprise a thin conformal barrier layer.

In one embodiment, access to previously non-investigated novel materials such as ZrN, HfN, ZrC, HfC, ZrB and HfB is enabled. Non-stoichiometric compositions for the various barrier layers that may be formed according to the various embodiments of the present invention are possible, as opposed to the stoichiometric limited compositions of prior art PVD and atomic layer deposition (ALD) formed barrier layers. The barrier materials of the embodiments of the present invention may comprise a signature composition and density associated with the embodiments of the invention, that may or may not be stoichiometric. Elemental impurity signatures may be readily detected by common elemental analysis methods known in the art.

Figure 2:
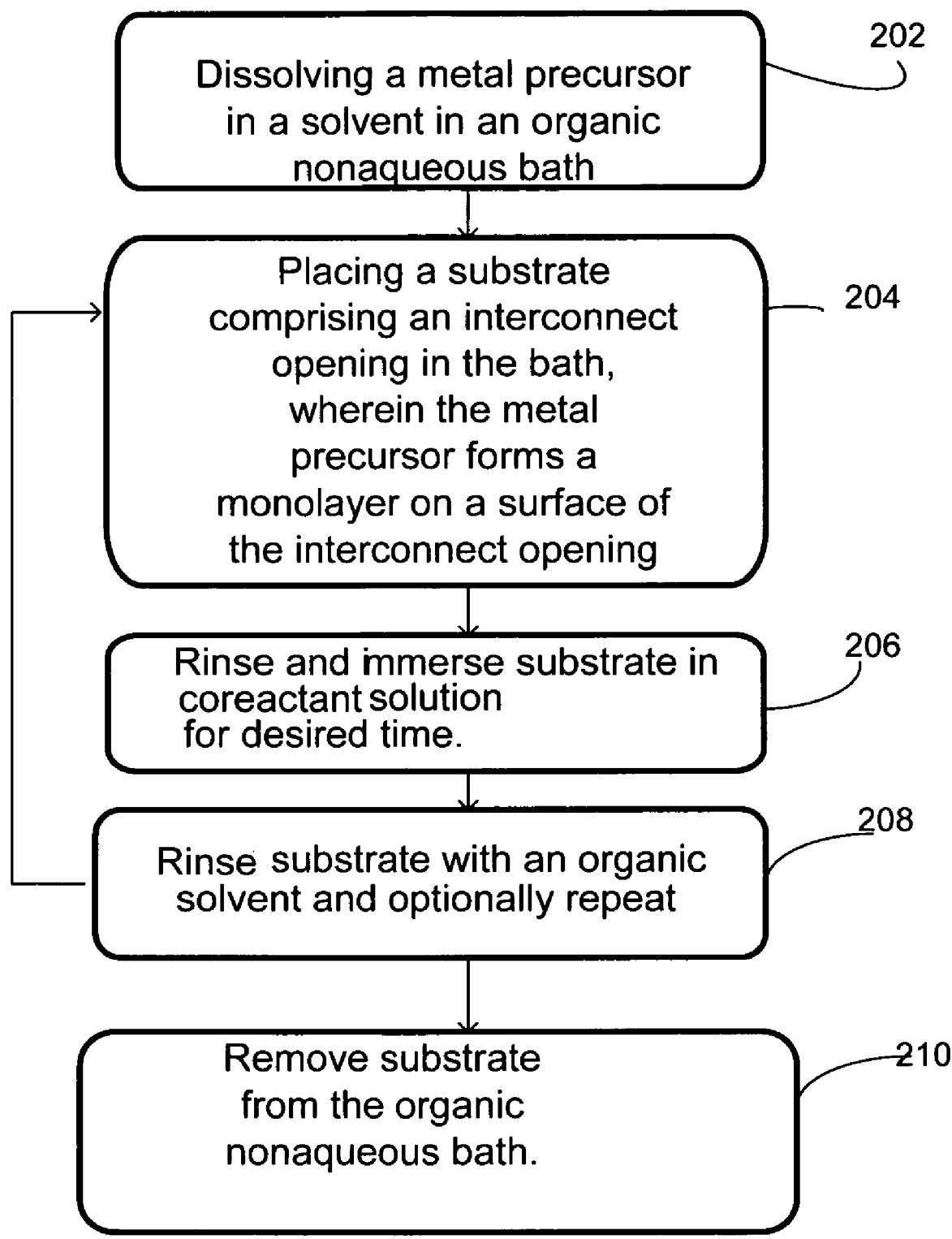
FIG. 2 represents a flow chart according to an embodiment of the methods of the present invention.

FIG. 2 depicts a flow chart of a process of forming a thin conformal barrier layer according to an embodiment of the present invention. At step 202, a a metal precursor may be dissolved in a solvent in an organic nonaqueous bath. At step 204, a substrate comprising an interconnect opening may be placed in the bath, wherein the metal precursor forms a monolayer on a surface of the interconnect opening. At step 206, the substrate may be rinsed and immersed in a coreactant solution for a desired time. At step 208, the substrate may be rinsed with an organic solvent and optionally the process may be repeated. At step 210, the substrate may be removed from the organic nonaqueous bath.

As described above, the methods of the present invention enable formation of extremely thin, single atomic layer, conformal, smooth barrier films that a may be utilized for achieving interconnect gapfill in back end microelectronic applications. A water-free organic plating bath is used to reduced barrier film oxidation. Thus, the reliability of microelectronic devices utilizing the thin conformal barrier layer formed according to the methods of the present invention are greatly enhanced. Access to previously non-investigated novel materials such as ZrN, HfN, ZrC, HfC, ZrB and HfB is enabled.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a barrier layers within a substrate, such as a silicon substrate, to manufacture a microelectronic device is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
   dissolving a metal precursor in a non-aqueous solvent in a bath;
   placing a substrate comprising an interconnect opening in the bath, wherein the metal precursor forms a monolayer within the interconnect opening; and
   placing the substrate in a coreactant mixture, wherein the coreactant reacts with the metal precursor such that a ligand of the metal precursor is replaced with a ligand of the coreactant to form a barrier monolayer.

2. The method of claim 1 further comprising wherein the metal precursor comprises a single metal center organometallic compound.

3. The method of claim 2 wherein the single metal center comprises one of titanium, tantalum, zirconium and hafnium.

4. The method of claim 1 wherein the coreactant comprises at least one of $NH_3$, tBuNH2, HNEt2, $NEt_3$, hexane, catechol borane, BH3/B2H6, $CH_4$, $SiH_4$, and $GeH_4$.

5. The method of claim 1 wherein forming the barrier monolayer comprises forming a barrier monolayer layer of at least one of TaN, TiN, ZrN, ZrC, HfC, ZrB and HfB.

6. The method of claim 1 wherein the metal precursor forms a monolayer within the interconnect opening comprises wherein a monolayer of the metal precursor adheres to the surface of the interconnect opening.

7. The method of claim 1 further comprising wherein the barrier monolayer comprises a thickness of less than about 1 angstrom.

8. The method of claim 7 further comprising wherein successive barrier monolayers layers are formed on each other to achieve a targeted total barrier layer thickness.

9. A method comprising:
   providing a substrate comprising an interconnect opening within a dielectric;
   placing the substrate in a bath comprising a metal precursor dissolved in a solvent, wherein the metal precursor forms an atomic layer on a surface of the interconnect opening; and
   placing the substrate in a coreactant mixture, wherein the coreactant reacts with the metal precursor such that a ligand of the metal precursor is replaced with a ligand of the coreactant to form a barrier monolayer for forming a thin barrier layer on the surface;
   forming a conductive layer on the thin barrier layer.

10. The method of claim 9 further comprising forming a plurality of barrier monolayers for forming the thin barrier layer, wherein the barrier monolayers comprise between about 0.2 angstroms to about 0.5 angstroms in thickness.

11. The method of claim 9 wherein forming the thin barrier layer comprises forming a thin conformal barrier layer on the surface.

* * * * *